(12) United States Patent
Chun et al.

(10) Patent No.: US 10,644,268 B2
(45) Date of Patent: May 5, 2020

(54) ORGANIC LIGHT EMITTING DISPLAY DEVICE WITH IMPROVED SUB-PIXEL STRUCTURE FOR REPAIR AND REPAIRING METHOD OF THE SAME

(71) Applicant: LG DISPLAY CO., LTD., Seoul (KR)

(72) Inventors: DaeWoong Chun, Paju-si (KR); Ilwan Jang, Namyangju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 276 days.

(21) Appl. No.: 15/334,897

(22) Filed: Oct. 26, 2016

(65) Prior Publication Data

US 2017/0194604 A1 Jul. 6, 2017

(30) Foreign Application Priority Data

Dec. 31, 2015 (KR) ........................ 10-2015-0191744

(51) Int. Cl.
*H01L 27/32* (2006.01)
*H01L 51/52* (2006.01)
*G09G 3/00* (2006.01)

(52) U.S. Cl.
CPC ......... *H01L 51/5281* (2013.01); *G09G 3/006* (2013.01); *H01L 27/326* (2013.01); *H01L 27/3244* (2013.01); *H01L 27/3248* (2013.01); *H01L 27/3262* (2013.01); *H01L 27/3265* (2013.01); *H01L 51/5209* (2013.01); *H01L 51/5225* (2013.01); *G09G 2300/0426* (2013.01); *G09G 2330/08* (2013.01); *G09G 2330/10* (2013.01); *H01L 2251/568* (2013.01)

(58) Field of Classification Search
CPC .................................................... H01L 27/326
See application file for complete search history.

(56) References Cited

U.S. PATENT DOCUMENTS

| 2002/0196208 | A1* | 12/2002 | Nanno | G09G 3/3655 345/55 |
| 2006/0273310 | A1* | 12/2006 | Birnstock | H01L 27/3204 257/40 |
| 2007/0046186 | A1 | 3/2007 | Kim | |
| 2010/0225831 | A1* | 9/2010 | Takeuchi | G02F 1/136213 348/739 |

(Continued)

FOREIGN PATENT DOCUMENTS

| CN | 1394320 A | 1/2003 |
| CN | 1881608 A | 12/2006 |

(Continued)

*Primary Examiner* — Robert T Huber
*Assistant Examiner* — Geoffrey H Ida
(74) *Attorney, Agent, or Firm* — Dentons US LLP

(57) ABSTRACT

Disclosed is an organic light emitting display device including a plurality of sub-pixels on an array substrate in which each sub-pixel includes a circuit part including a switching transistor, a driving transistor and a capacitor; and a light emitting part having a shape defined with a width and a length and including a first electrode electrically connected to the driving transistor, an organic light emitting layer and a second electrode, the first electrode including a first pattern having a recess, a second pattern having a protrusion received in the recess, and a third pattern connecting the first and second patterns, wherein a depth of the recess is greater than a half of a longer of the width and the length of the light emitting part.

12 Claims, 17 Drawing Sheets

(56) References Cited

U.S. PATENT DOCUMENTS

2011/0175885 A1    7/2011   Shirouzu

FOREIGN PATENT DOCUMENTS

| CN | 101379538 | A  | 3/2009  |
|----|-----------|----|---------|
| CN | 100488325 | C  | 5/2009  |
| CN | 101983398 | A  | 3/2011  |
| CN | 104103234 | A  | 10/2014 |
| EP | 2787499   | A1 | 10/2014 |
| JP | 2010060803| A  | 3/2010  |
| KR | 20150112447| A | 10/2015 |

* cited by examiner

FIG.17
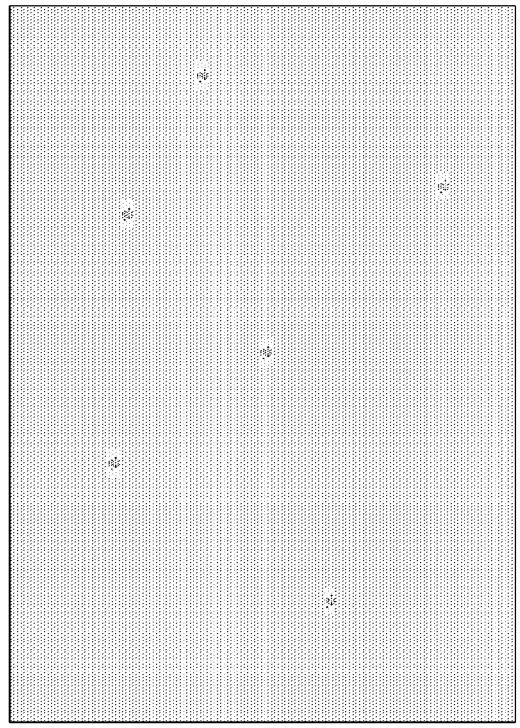
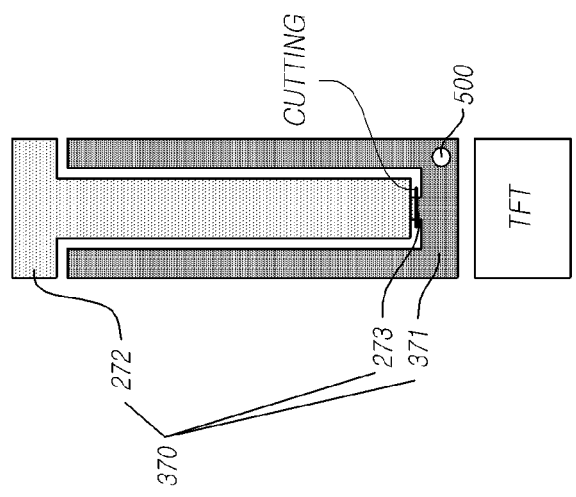

ORGANIC LIGHT EMITTING DISPLAY DEVICE WITH IMPROVED SUB-PIXEL STRUCTURE FOR REPAIR AND REPAIRING METHOD OF THE SAME

CROSS-REFERENCE TO RELATED APPLICATIONS

This application claims priority from and the benefit of Korean Patent Application No. 2015-0191744 filed on Dec. 31, 2015, which is hereby incorporated by reference for all purposes as if fully set forth herein.

BACKGROUND

Field of the Invention

The present exemplary embodiments relate to an organic light emitting display device, a manufacturing method of the same and a repairing method of the same.

Description of the Related Art

With progress to the information-oriented society, various demands for display devices for displaying an image are increasing. Recently, various kinds of flat panel display devices such as a liquid crystal display (LCD) device, a plasma display panel (PDP) device, an organic light emitting diode (OLED) display device, etc. have been used.

Of the above-described display devices, an OLED display device can be manufactured with a lightweight and thin profile design, since it uses a self-light emitting element and thus, does not typically need a backlight used for a liquid crystal display (LCD) device, which uses a non-emitting element. Further, the OLED display device is excellent in viewing angle and contrast ratio and advantageous in terms of power consumption as compared with the LCD device. In addition, the OLED display device can be driven with a low DC voltage and has a high response speed and includes internal components in the form of solids. Therefore, the OLED display device has the advantages of a high resistance to external shocks, a wide category temperature range, and particularly, low manufacturing costs.

Such an OLED display device displays an image in a top-emission manner or a bottom-emission manner depending on a structure of an organic light emitting element, which typically includes a first electrode, a second electrode, and an organic light emitting layer. In the bottom-emission manner, a visible light generated from the organic light emitting layer is displayed on a bottom side of a substrate on which a TFT is formed. On the other hand, in the top-emission manner, a visible light generated from the organic light emitting layer is displayed on a top side of the substrate on which the TFT is formed.

While manufacturing an OLED display device, a foreign substance may remain on the first electrode of the organic light emitting element and thus, may cause a dark spot defect. In order to address such a dark spot defect, a technique of repairing and thus normalizing a portion of the first electrode where a foreign substance remains has been suggested. For example, when a foreign substance is present on a top portion of the first electrode in a plane view, a bottom portion of the first electrode where a foreign substance is not present can be repaired and normalized. However, a region corresponding to the unrepaired top portion of the first electrode may still be seen as a dark spot.

SUMMARY

Accordingly, the present invention is directed to an organic light emitting display device, a manufacturing method of the same and a repairing method of the same that substantially obviate one or more of the problems due to limitations and disadvantages of the related art.

An advantage of the present invention is to provide an organic light emitting display device with an improved sub-pixel structure for repair.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display device including a plurality of sub-pixels on an array substrate, each sub-pixel that may, for example, include a circuit part including a switching transistor, a driving transistor and a capacitor; and a light emitting part having a shape defined with a width and a length and including a first electrode electrically connected to the driving transistor, an organic light emitting layer and a second electrode, the first electrode including a first pattern having a recess, a second pattern having a protrusion received in the recess, and a third pattern connecting the first and second patterns, wherein a depth of the recess is greater than a half of a longer of the width and the length of the light emitting part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 17 is a diagram illustrating a sub-pixel and a panel of an organic light emitting display device according to the first exemplary embodiment.

DETAILED DESCRIPTION OF THE ILLUSTRATED EMBODIMENTS

Figure 1:
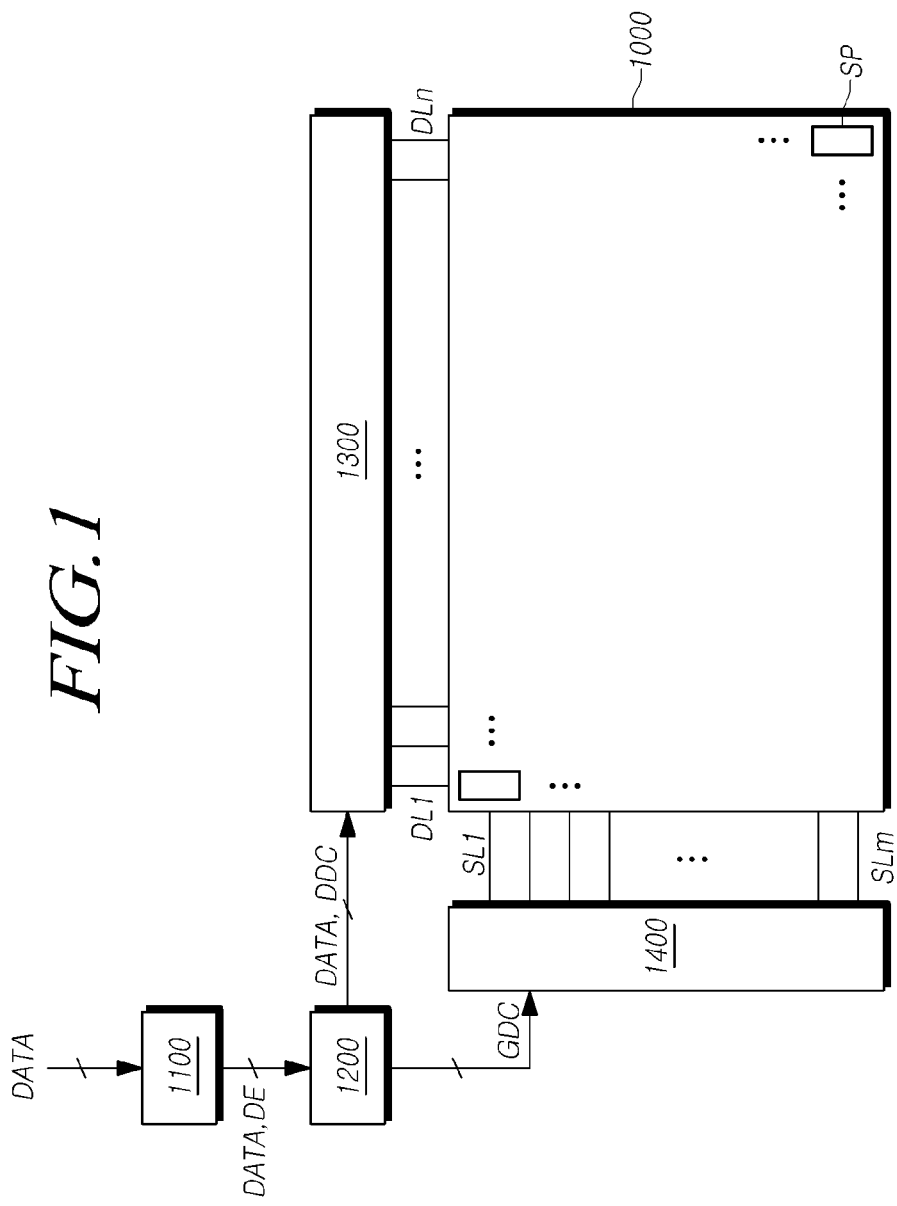
FIG. 1 is a schematic block configuration view of an organic light emitting display device to which the present exemplary embodiments are applied.

Reference will now be made in detail to embodiments of the present invention, examples of which are illustrated in the accompanying drawings. The following exemplary embodiments are provided for sufficiently conveying the concept of the present disclosure to those skilled in the art. Therefore, the present disclosure is not limited to the following exemplary embodiments themselves but can be modified and changed in other embodiments. Further, in the drawings, the size and thickness of a device may be exaggerated for convenience. Like reference numerals generally denote like elements throughout the present specification.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification. In the drawings, the sizes and relative sizes of layers and regions may be exaggerated for clarity.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below", "beneath", "lower", "above", "upper", etc. may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

FIG. 1 is a schematic block configuration view of an organic light emitting display device to which the present exemplary embodiments are applied.

Referring to FIG. 1, an organic light emitting display device according to the present exemplary embodiments includes a display panel 1000, an image processor 1100, a timing controller 1200, a data driver 1300, and a scan driver 1400.

The image processor 1100 outputs a data signal DATA supplied from the outside together with a data enable signal DE. The image processor 1100 may output one or more of a vertical synchronization signal, a horizontal synchronization signal, and a clock signal in addition to the data enable signal DE, but illustration of these signals will be omitted for convenience in explanation.

The timing controller 1200 is supplied with the data enable signal DE or driving signals including a vertical synchronization signal, a horizontal synchronization signal, and a clock signal together with a data signal DATA from the image processor 1100. The timing controller 1200 outputs a gate timing control signal GDC for controlling an operation timing of the scan driver 1400 and a data timing control signal DDC for controlling an operation timing of the data driver 1300 on the basis of the driving signals.

The data driver 1300 samples and latches the data signal DATA supplied from the timing controller 1200 and converts the data signal DATA into a voltage corresponding to a gamma reference voltage and then outputs the voltage in response to the timing control signal DDC supplied from the timing controller 1200. The data driver 1300 outputs the data signal DATA through data lines DL1 to DLn. The data driver 1300 is formed into an integrated circuit (IC).

The scan driver 1400 outputs a scan signal while shifting a level of a gate voltage in response to the gate timing control signal GDC supplied from the timing controller 1200. The scan driver 1400 outputs the scan signal through scan lines SL1 to SLm. The scan driver 1400 may be formed into an integrated circuit (IC) or formed on a non-display region of the display panel 1000 by a gate-in-panel method.

The display panel 1000 displays an image in response to the data signal DATA and the scan signal supplied from the data driver 1300 and the scan driver 1400. The display panel 1000 is disposed between a substrate and a protective substrate and includes sub-pixels SP that display an image. The substrate and the protective substrate may be formed of a material such as glass or resin, and are sealed to protect the sub-pixels SP from moisture or oxygen.

The sub-pixels SP are formed by a top-emission method, a bottom-emission method, or a dual-emission method depending on a structure. The sub-pixels SP may include a red sub-pixel, a green sub-pixel, and a blue sub-pixel or may include a white sub-pixel, a red sub-pixel, a green sub-pixel, and a blue sub-pixel by way of example. The organic light emitting display device according to the present exemplary embodiments is not limited thereto.

Meanwhile, if the sub-pixels SP include a white sub-pixel, a red sub-pixel, a green sub-pixel, and a blue sub-pixel, it may include an organic light emitting diode that emits a white light and a color filter. The sub-pixels SP may have one or more different light emitting areas depending on a light emitting characteristic.

The sub-pixels SP may include a circuit part including a switching transistor, a driving transistor, and a capacitor and an organic light emitting element or may include a circuit part including therein a compensation circuit configured to compensate a threshold voltage of a driving transistor. However, the organic light emitting display device according to the present exemplary embodiments is not limited thereto.

Figure 2:
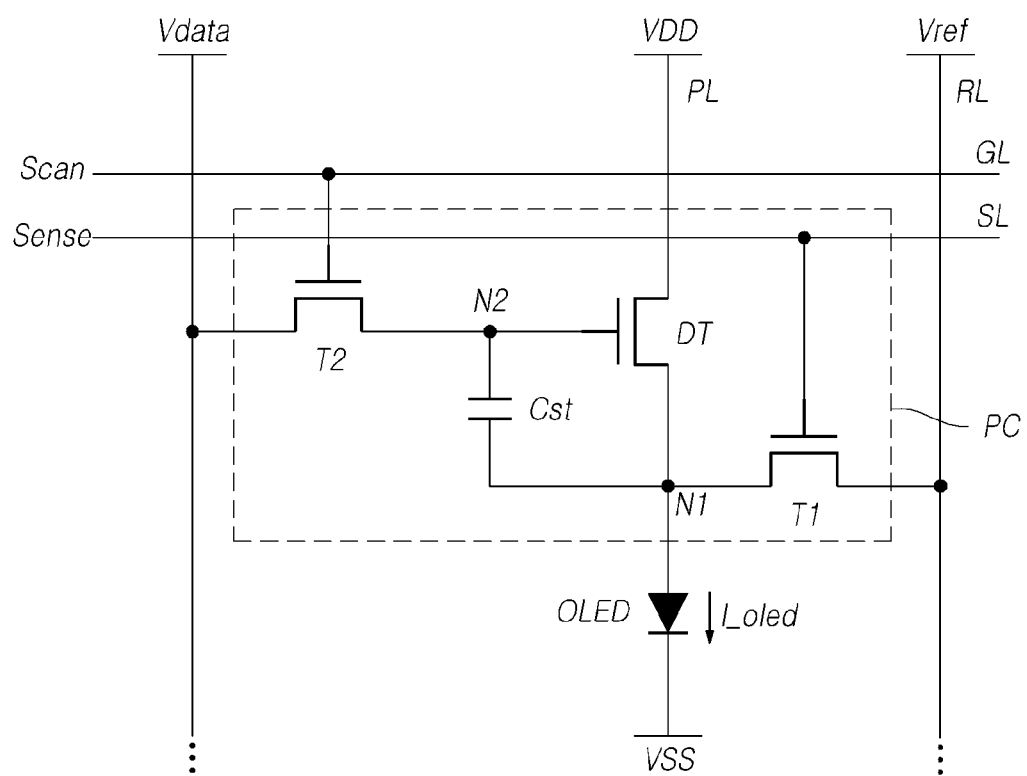
FIG. 2 is a diagram illustrating a circuit diagram of a sub-pixel of an organic light emitting display device according to the present exemplary embodiments.

Hereinafter, a circuit diagram of a sub-pixel of an organic light emitting display device according to the present exemplary embodiments will be described. FIG. 2 is a diagram illustrating a circuit diagram of a sub-pixel of an organic light emitting display device according to the present exemplary embodiments.

Referring to FIG. 2, each pixel of a display panel includes an organic light emitting diode OLED that emits a light in response to an input data current Ioled and a pixel circuit PC configured to drive the organic light emitting element OLED. Further, in the display panel, a plurality of lines configured to supply driving power and signals to the organic light emitting element OLED and the pixel circuit PC are provided.

Herein, the pixel circuit PC includes a first transistor T1, a second transistor T2, a driving transistor DT, and a capacitor Cst. Herein, the capacitor Cst may be disposed between a first node N1 and a second node N2. Further, the plurality of lines include a data line DL, a gate line GL, a driving power line PL, a sense signal line SL, and a reference power line RL.

The second transistor T2 is switched in response to a scan signal (gate driving signal) supplied to the gate line GL. When the second transistor T2 is turned on, a data voltage Vdata supplied to the data line DL is supplied to the driving transistor DT. Further, the driving transistor DT is switched in response to the data voltage Vdata supplied from the second transistor T2. By switching the driving transistor DT, the data current Ioled flowing to the organic light emitting element OLED is controlled.

Further, if a scan signal is applied through the gate line GL, the second transistor T2 is turned on. In this case, a signal from the second transistor T2 is input into a gate electrode of the driving transistor DT, and, thus, the driving transistor DT is turned on. If the driving transistor DT is turned on, a driving current applied through the driving power line PL is input into the organic light emitting element OLED, and, thus, the organic light emitting element OLED emits a light. Herein, the driving transistor DT and the organic light emitting element OLED may be connected through the first node N1.

Further, the sense signal line SL is formed in the same direction as the gate line GL for an external compensation. The second transistor T2 is configured to be switched in response to a sense signal sense applied to the sense signal line SL. An analog-to-digital converter (ADC) of a data drive IC is used to sense the data current Ioled supplied to the organic light emitting element OLED by switching the first transistor T1. A data voltage supplied to each pixel is compensated depending on a sensing value of each pixel sensed by the ADC, so that a threshold voltage Vth of the driving transistor DT and a change in mobility can be compensated.

Figure 3:
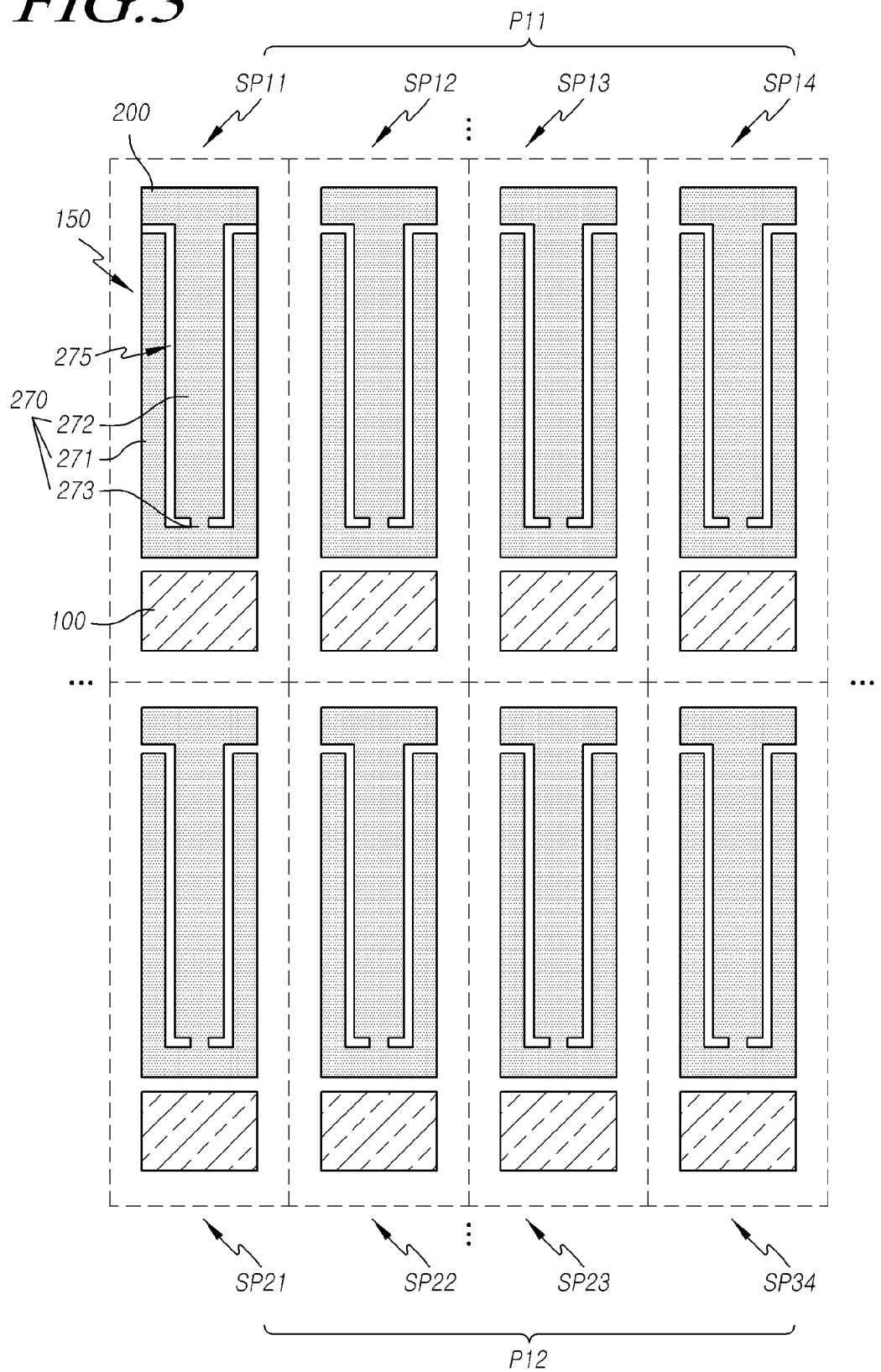
FIG. 3 is a diagram schematically illustrating a circuit part and a light emitting part in each of a plurality of sub-pixels of an organic light emitting display device according to the first exemplary embodiment.

FIG. 3 is a diagram schematically illustrating a circuit part and a light emitting part in each of a plurality of sub-pixels of an organic light emitting display device according to the first exemplary embodiment.

Referring to FIG. 3, the organic light emitting display device according to the first exemplary embodiment includes a plurality of pixels P1, P2, . . . . Each of pixels P11, P12, . . . includes a plurality of sub-pixels SP11, SP12, SP13, SP14, SP21, SP22, SP23, SP24, . . . .

To be specific, a first pixel P1 includes a first sub-pixel SP11, a second sub-pixel SP12, a third sub-pixel SP13, and a fourth sub-pixel SP14, and a second pixel P2 includes a fifth sub-pixel SP21, a sixth sub-pixel SP22, a seventh sub-pixel SP23, and an eighth sub-pixel SP 24. Although FIG. 3 illustrates a configuration in which one pixel includes four sub-pixels, the organic light emitting display device according to the first exemplary embodiment is not limited thereto. For example, one pixel may include two or three sub-pixels.

Each of the sub-pixels SP11, SP12, SP13, SP14, SP21, SP22, SP23, SP34, . . . includes a circuit part 100 and a light emitting part 150. The circuit part 100 may include at least one transistor. Further, the light emitting part 150 is a region of the first electrode through which light is emitted from each sub-pixel. For example, the light emitting part 150 is a region opened by a bank pattern. A first electrode 270, an organic light emitting layer, and a second electrode of an organic light emitting element may be disposed therein. Herein, the first electrode 270 may include a first pattern 271, a second pattern 272, and a third pattern 273. In this case, each of the first pattern 271 and the second pattern 272 may include a plurality of regions. Further, some of the plurality of regions in the first pattern 271 and some of the plurality of regions in the second pattern 272 may be disposed alternately.

Figure 4:
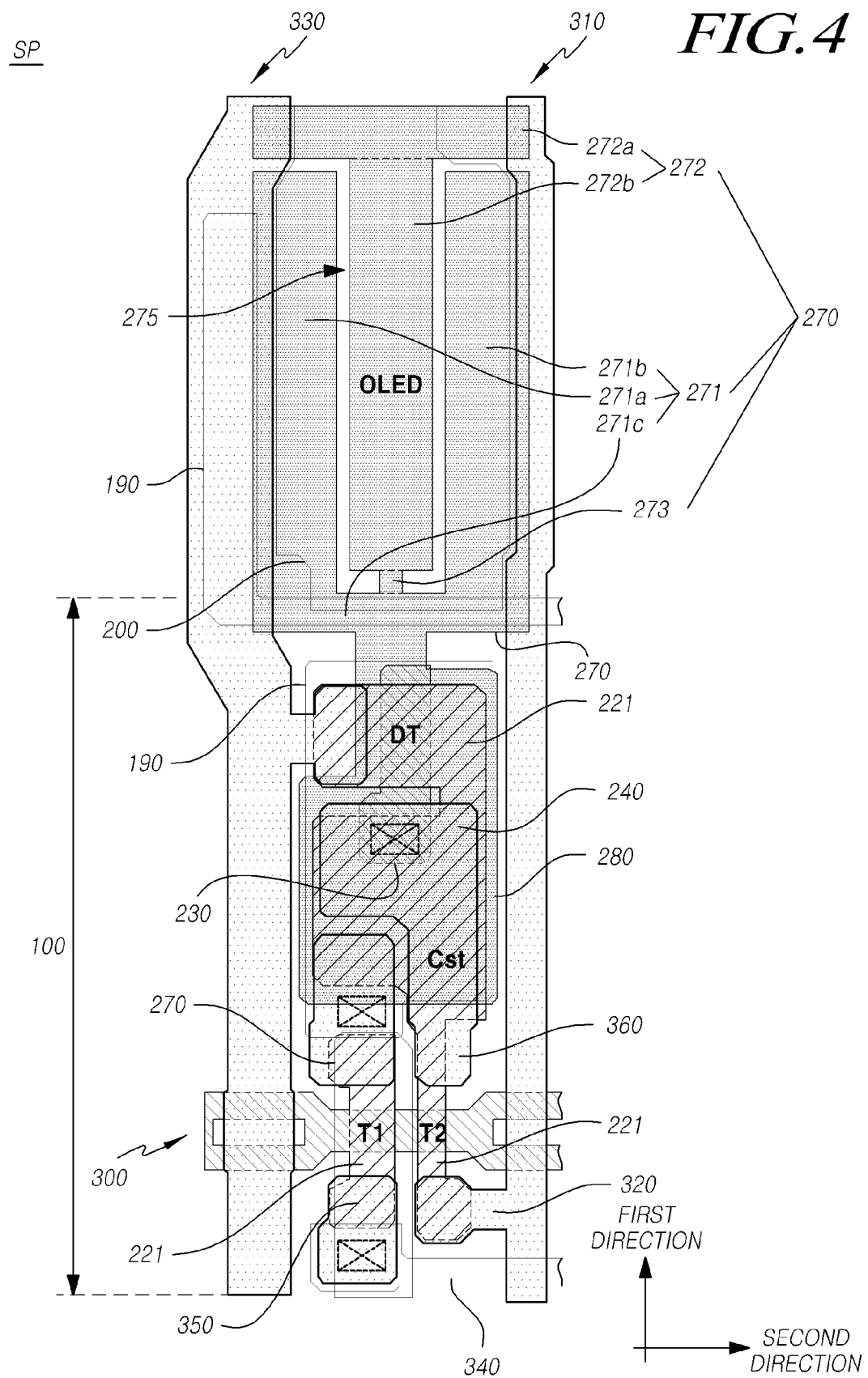
FIG. 4 is a plane view illustrating a sub-pixel of an organic light emitting display device to which the first exemplary embodiment is applied.

Meanwhile, a configuration of a sub-pixel in a display panel to which the above-described first exemplary embodiment is applied will now be described in detail. FIG. 4 is a plane view illustrating a sub-pixel of an organic light emitting display device to which the first exemplary embodiment is applied.

Referring to FIG. 4, a sub-pixel SP in a display device to which the above-described first exemplary embodiment is applied is defined by a gate line 300 and a data line 310 crossing each other. The sub-pixel SP may include the driving transistor DT, the first transistor T1, the second transistor T2, one storage capacitor Cst, and one organic light emitting element OLED.

To be specific, the second transistor T2 is controlled by a scan signal supplied from the gate line 300 and supplied with a data voltage from the data line 310. Further, the first transistor T1 is controlled by a scan signal supplied from the gate line 300 and supplied with a reference voltage Vref from a first line 350 connected to a reference voltage line 330.

Further, the second transistor T2 is controlled by a scan signal supplied from the gate line 300 and supplied with a data voltage from a second line 320 connected to the data line 310. The second transistor T2 is connected to a plate 240 through a contact hole 360, and the plate 240 is connected to a gate electrode 230 of the driving transistor DT through a second contact hole 210. Herein, the plate 240 may be formed of the same material as the data line 310.

Further, the driving transistor DT is controlled by a voltage applied to the gate electrode 230, and receives a driving voltage EVDD through a drain node from the driving voltage line 330 and outputs a current to a source node.

In FIG. 4, it is assumed to have an oxide transistor structure by way of example. An active layer 221 is disposed in order to form a source node of the driving transistor DT and a source node of the first transistor T1. The active layer 221 and the plate 240 connected to the second transistor T2 may form the storage capacitor Cst. Further, in the sub-pixel SP, a light shield (LS) 190 may be disposed for protecting circuits of the transistors, etc.

Further, the first electrode 270 of the organic light emitting element OLED connected to a source electrode of the driving transistor DT through a contact hole is disposed. Herein, the source electrode of the driving transistor DT may be disposed on the same layer as the plate 240 constituting the storage capacitor Cst. Although FIG. 4 illustrates a configuration in which the first electrode 270 of the organic light emitting element OLED is connected to the source electrode, the present exemplary embodiment is not limited thereto, and the first electrode 270 may be connected to a drain electrode.

A part of a top surface of the first electrode 270 of the organic light emitting element OLED may be exposed by the bank pattern 200. On the exposed top surface of the first electrode 270, the organic light emitting layer (not illustrated) of the organic light emitting element OLED may be disposed. On the substrate on which the organic light emitting layer (not illustrated) is disposed, the second electrode (not illustrated) of the organic light emitting element OLED may be disposed. Herein, a region of the first electrode 270 exposed by the bank pattern 200 may be defined as a light emitting part of the sub-pixel SP.

Meanwhile, an electrode connected to a transistor that controls emission of each sub-pixel is referred to as the first electrode 270, and an electrode disposed on an entire surface of the display panel or disposed to include two or more sub-pixel regions is referred to as the second electrode. Herein, if the first electrode 270 is an anode electrode, the second electrode is a cathode electrode, and vice versa. For brevity, the first electrode 270 will now be described as an anode electrode and the second electrode will be described as a cathode electrode in an exemplary embodiment, but the present disclosure is not limited thereto.

Further, the first electrode 270 of the organic light emitting element OLED according to the first exemplary embodiment may include the first pattern 271 including at least one predetermined space 275, the second pattern 272 coupled to the predetermined space 275 of the first pattern 271, and the third pattern 273 connecting the first and second patterns 271 and 272. Herein, the first pattern 271 may have a U-shape and the second pattern 272 may have a T-shape. Further, the third pattern 273 may have an I-shape.

To be specific, the first pattern 271 of the first electrode 270 includes a first region 271a and a second region 271b extended in a first direction and disposed so as to be separate from each other. The first region 271a and the second region 271b may be connected to each other through a third region 271c extended in a second direction intersecting with the first direction. To be more specific, one end of the first region 271a may be connected to one end of the third region 271c and one end of the second region 271b may be connected to the other end of the third region 271c.

That is, the first region 271a and the second region 271b disposed so as to be separate from each other may be connected to each other through the third region 271c. Meanwhile, due to the first region 271a and the second region 271b disposed so as to be separate from each other, the first pattern 271 of the first electrode 270 may include the predetermined space 275. Herein, the first region 271a and the second region 271b of the first electrode 270 may be disposed so as to be parallel with each other, but the configuration according to the present exemplary embodiment is not limited thereto. The first region 271a and the second region 271b do not need to be parallel with each other as long as they are disposed so as to be separate from each other.

Further, the second pattern 272 of the first electrode 270 includes a fourth region 272a extended in the second direction and a fifth region 272b extended in the first direction and connected to a part of the fourth region 272a. Herein, the fifth region 272b of the second pattern 272 may be disposed on a portion of the predetermined space 275 formed due to the first pattern 271. Herein, the first region 271a and the second region 271b of the first pattern 271 may be disposed so as to be separate from the fourth region 272a and the fifth region 272b of the second pattern. Further, the third region 271c of the first pattern 271 and the fifth region 272b of the second pattern 272 may be connected to each other through the third pattern 273.

In other words, the T-shaped second pattern 272 is coupled to the predetermined space 275 of the U-shaped first pattern 271 and the I-shaped third pattern 273 may connect the first pattern 271 and the second pattern 272. To describe it another way, the first pattern 271 has a recess and the second pattern 272 has a protrusion received in the recess, with the third pattern 273 connecting the first and second patterns 271 and 272. According to an embodiment of the present invention, a depth of the recess is greater than ½, ⅔, ¾, ⅘ . . . etc. of a longest dimension of the light emitting part. Accordingly, a current can be smoothly transferred to the first to third patterns 271, 272, and 273 of the first electrode 270 from the circuit part 100.

To be specific, the current transferred from the circuit part 100 is transferred to the first pattern 271 of the first electrode 270. Then, the current transferred to the first pattern 271 is transferred to the second pattern 272 through the third pattern 273. Thus, the current can be transferred to the whole first electrode 270. Accordingly, the light emitting part 150 as the region opened by the bank pattern 200 may emit a light having a specific wavelength.

Meanwhile, a size of sub-pixels has been decreased for high resolution of a display panel, whereas the number of process steps has been increased, so that the design rule has become tighter. As a result, the number of process defects and flaws has been on the increase. Further, due to the characteristics of a circuit constituting a sub-pixel, elements of a compensation circuit for driving and compensation are added or increased, thereby further increasing the ratio of defect occurrence.

If a defect occurs in a sub-pixel disposed on the display panel, the yield of the display panel can be increased by partially laser-repairing a defective transistor or signal line or darkening the sub-pixel which becomes a bright spot. However, such a method may take a long time to perform the process and may not be suitable for a case where a defect occurs at a non-repairable location.

An organic light emitting display device according to the present exemplary embodiments is configured to reduce or prevent a dark spot even when a defect occurs in a sub-pixel disposed on a display panel by changing an electrode structure of an organic light emitting element.

Figure 5:
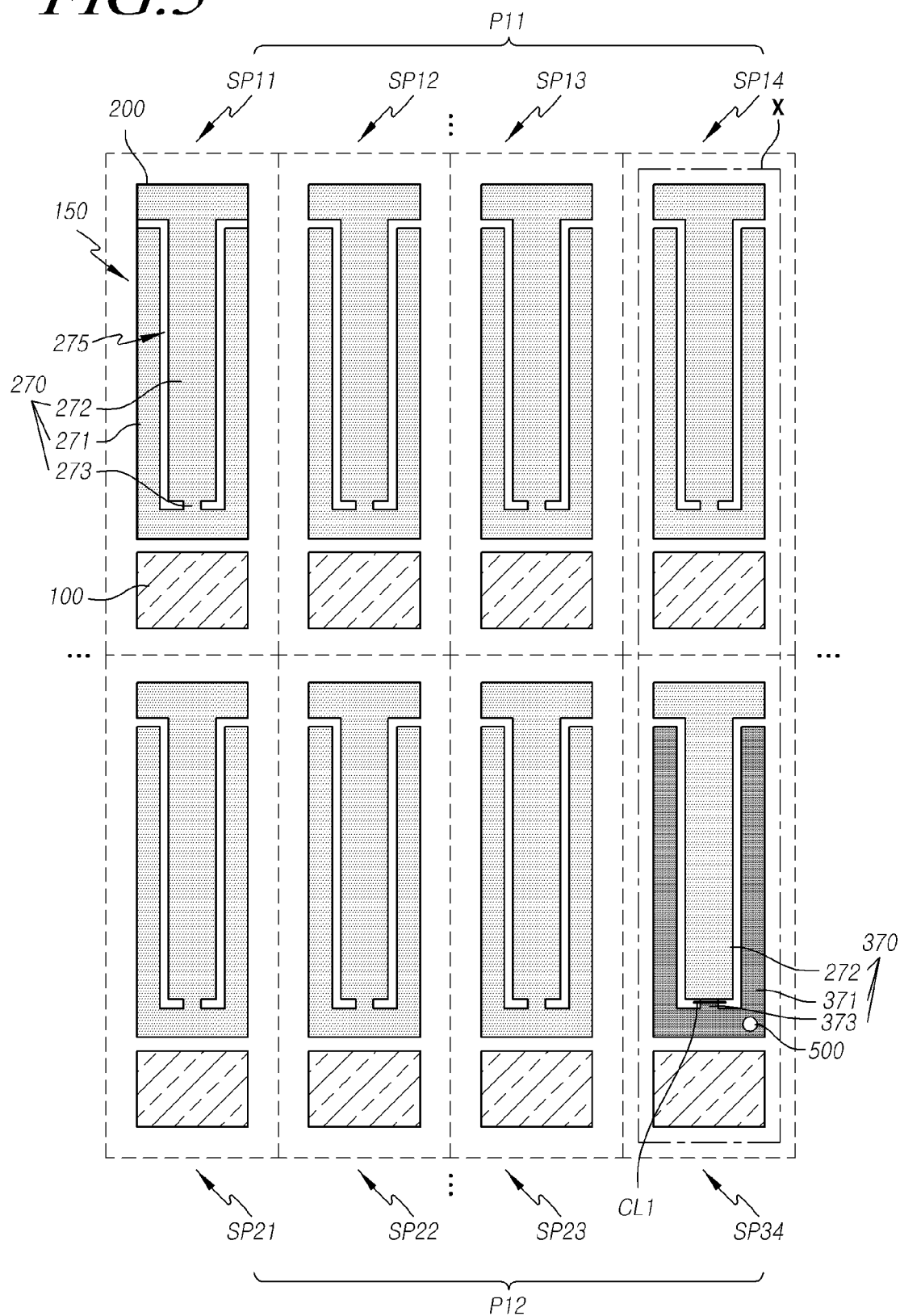
FIG. 5 is a diagram illustrating a configuration including a sub-pixel where a foreign substance is present on a first pattern of a first electrode in an organic light emitting element of the organic light emitting display device according to the first exemplary embodiment.

FIG. 5 is a diagram illustrating a configuration including a sub-pixel where a foreign substance is present on a first pattern of a first electrode in an organic light emitting element of the organic light emitting display device according to the first exemplary embodiment.

Referring to FIG. 5, a foreign substance 500 may be present on at least one of the plurality of sub-pixels of the organic light emitting display device according to the first exemplary embodiment. The foreign substance 500 may be generated during a process of forming the circuit part 100 or the light emitting part 150.

If the foreign substance 500 is present on the light emitting part 150, a pattern of a first electrode 370 positioned at a region corresponding to the region where the foreign substance 500 is present may be electrically disconnected from the circuit part 100. For example, as illustrated in FIG. 5, if the foreign substance 500 is present on a first pattern 371 of the first electrode 370, the first electrode 370 may be laser-cut along a cutting line CL1 to electrically disconnect the second pattern 272 of the first electrode 370 from the whole of the first pattern 371 and a part or whole of a third pattern 373. However, in the following, a region of the third pattern 373 cut along the first cutting line CL1 and electrically disconnected will not be separately described as a part or whole of the third pattern 373 for convenience in explanation. The configuration in which the first cutting line CL1 is positioned on the third pattern 373 is sufficient for the present exemplary embodiment.

Further, the first pattern 371 of the first electrode 370 is electrically disconnected from the circuit part 100. Then, the second pattern 272 of the first electrode 370 where the foreign substance 500 is not present is connected to the circuit part 100 of another sub-pixel adjacent thereto, so that only a region where the second pattern 272 of the first electrode 370 is disposed emits a light. This configuration will be described in detail with reference to FIG. 6.

Figure 6:
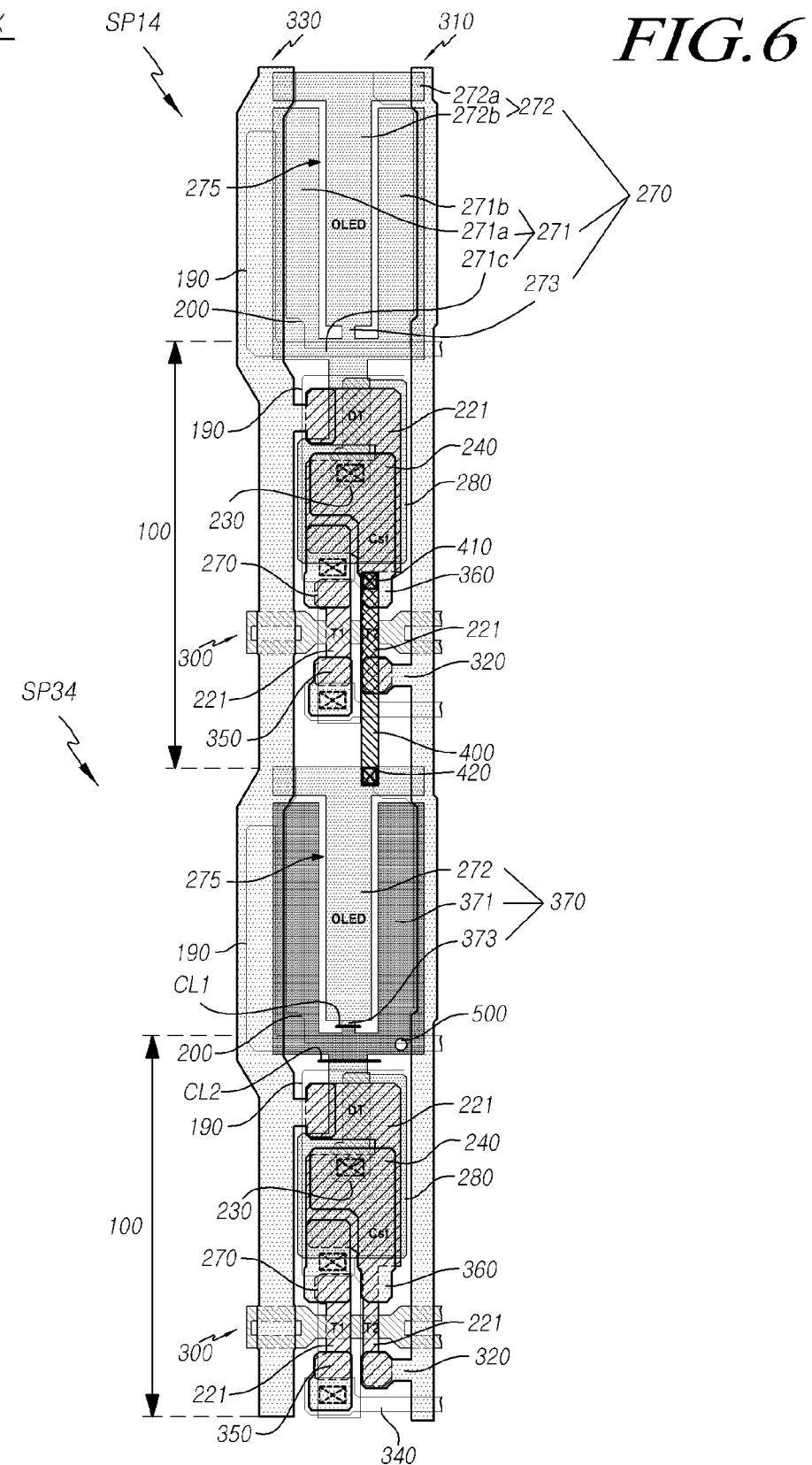
FIG. 6 is an enlarged view of region X of FIG. 5.

FIG. 6 is an enlarged view of region X of FIG. 5. In FIG. 6, it is assumed that the sub-pixel where the foreign substance 500 is present is the eighth sub-pixel SP34, and that a sub-pixel adjacent to the eighth sub-pixel SP34 is the fourth sub-pixel SP14 by way of example. The sub-pixel where the foreign substance 500 is present is not limited to the eighth sub-pixel SP34.

Referring to FIG. 6, the foreign substance 500 may be present on the first pattern 371 of the first electrode 370 in the eighth sub-pixel SP34 of the organic light emitting display device according to the first exemplary embodiment. Herein, in a region corresponding to the first pattern 371, a dark spot defect may occur due to the foreign substance 500. Meanwhile, a defect of a sub-pixel caused by the foreign substance 500 may be determined through an inspection process. In the sub-pixel determined as having a defect through the inspection process, the first pattern 371 and the second pattern 272 of the first electrode 370 may be electrically disconnected from each other.

To be specific, the second pattern 272 of the first electrode 370 is disconnected from the first pattern 371 by, for example, irradiating a laser along the first cutting line CL1. In particular, a part of the third pattern 373 may be laser-cut to disconnect the second pattern 272 of the first electrode 370 from the first pattern 371. As a result, a current generated from the circuit part 100 of the eighth sub-pixel SP34 is not transferred to the second pattern 272 of the first electrode 370. Further, if the foreign substance 500 is present on the first pattern 371 of the first electrode 370, the first pattern 371 may be disconnected from the circuit part 100 along a second cutting line CL2. Accordingly, it is possible to electrically disconnect the first pattern 371 that causes a dark spot.

Meanwhile, the second pattern 272 of the first electrode 370 disposed in the eighth sub-pixel SP34 may emit a light as being electrically connected to the circuit part 100 in the sub-pixel SP14 adjacent to the eighth sub-pixel SP34. In other words, the second pattern 272 of the first electrode 370 disposed in the eighth sub-pixel SP34 may be electrically connected to the plate 240 of the fourth sub-pixel SP14 adjacent to the eighth sub-pixel SP34 through a repair pattern 400.

To be more specific, the second pattern 272 of the first electrode 370 disposed in the eighth sub-pixel SP34 may be connected to the repair pattern 400 by a welding process of, for example, irradiating a laser and thus may be connected to the plate 240 of the fourth sub-pixel SP14 through a first contact hole 410. In other words, the repair pattern 400 may be connected to the plate 240 of the fourth sub-pixel SP14 through the first contact hole 410 and may also be connected to the second pattern 272 of the first electrode 370 in the eighth sub-pixel SP34 through a second contact hole 420. Although not illustrated in the drawing, the first contact hole 410 may be formed in at least one insulation layer.

Meanwhile, a shape of the repair pattern 400 is not limited to the shape illustrated in FIG. 6 as long as the repair pattern 400 is configured to connect the plate 240 of the fourth sub-pixel SP14 to the second pattern 272 of the first electrode 370 in the eighth sub-pixel SP34.

As a result, when the storage capacitor Cst in the fourth sub-pixel SP14 transfers a signal to the driving transistor DT of the fourth sub-pixel SP14, the signal is also transferred to the second pattern 272 of the first electrode 370 disposed in the eighth sub-pixel SP34 along the repair pattern 400. Thus, in a region corresponding to the second pattern 272 disposed in the eighth sub-pixel SP34, the organic light emitting element OLED may emit a light. That is, the eighth sub-pixel SP34 may be supplied with a current from the fourth sub-pixel SP14 to emit a light. In other words, the circuit part 100 included in the fourth sub-pixel SP14 may drive the light emitting part of the fourth sub-pixel SP14 and a part of the light emitting part of the eighth sub-pixel SP34.

As described above, if the organic light emitting element OLED emits a light in the region corresponding to the second pattern 272 of the first electrode 370 in the eighth sub-pixel SP34, a dark spot defect caused by the foreign substance 500 can be reduced or addressed. FIG. 5 and FIG. 6 illustrate a configuration in which the foreign substance 500 is present on the first pattern 371 of the first electrode 370. However, even if the foreign substance 500 is present on the third pattern 373 of the first electrode 370, a dark spot defect of the organic light emitting display device according to the first exemplary embodiment can be addressed by applying the above-described repair pattern 400.

Figure 7:
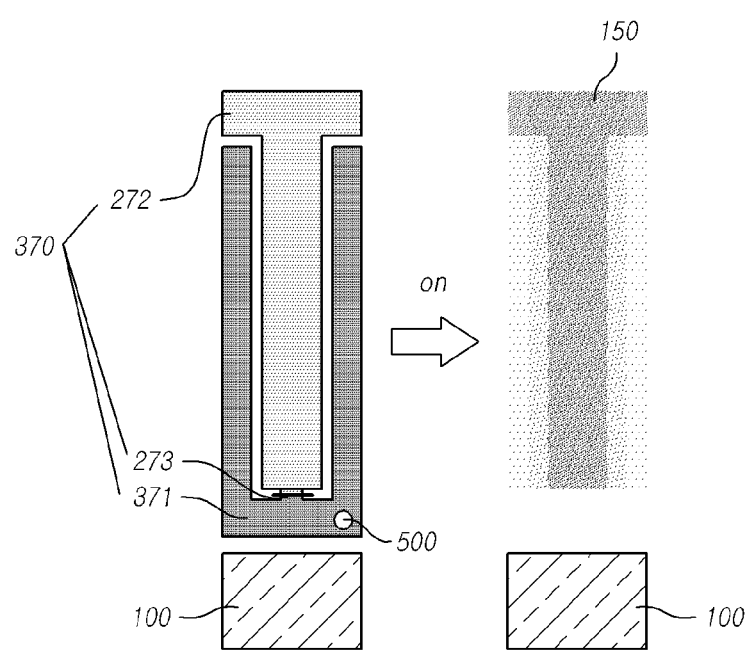
FIG. 7 is a diagram illustrating the light emitting part when the organic light emitting element disposed in a sub-pixel where a foreign substance is present is driven in the organic light emitting display device according to the first exemplary embodiment.

FIG. 7 is a diagram illustrating the light emitting part when the organic light emitting element disposed in a sub-pixel where a foreign substance is present is driven in the organic light emitting display device according to the first exemplary embodiment.

Referring to FIG. 7, when the organic light emitting element disposed in the sub-pixel where the foreign substance is present in the organic light emitting display device according to the first exemplary embodiment is turned on, the organic light emitting element may emit a light through the region where the second pattern 272 of the first electrode 370 is disposed.

Meanwhile, in order to improve a dark spot defect, a technique of repairing and thus normalizing a portion of the first electrode 370 where a foreign substance is present has been suggested. For example, when a foreign substance is present on a top portion of the first electrode 370, a central portion of the first electrode 370 may be cut and a bottom portion of the first electrode 370 where a foreign substance is not present may be repaired. That is, the top portion of the first electrode 370 is disconnected and only the bottom portion is normalized. However, a semi-dark spot defect may still occur where a region corresponding to the unrepaired top portion of the first electrode 370 is seen as a dark spot.

However, as illustrated in FIG. 7, when the organic light emitting element according to the present exemplary embodiment emits a light in the region where the second pattern 272 of the first electrode 370 is disposed, the viewer can see the light as if it is emitted from the entire light emitting part 150 due to light diffusion. As a result, even if a part of the first electrode 370 is electrically disconnected from the circuit part 100 by the foreign substance 500, the dark spot defect can be reduced or prevented.

To be specific, even if the first pattern 371 of the first electrode 370 where the foreign substance 500 is present is electrically disconnected and a light is emitted from the region where the second pattern 272 is disposed, the second pattern 272 of the fourth region extended in the second direction and the fifth region branched from the fourth region and extended in the first direction can be used to reduce or prevent the semi-dark spot defect caused by the first pattern 371 through light diffusion. That is, since the light emitted from the region corresponding to the second pattern 272 is diffused to the region where the first pattern 371 is disposed, the viewer can see the light as if it is emitted from the entire light emitting part of the sub-pixel.

Figure 8:
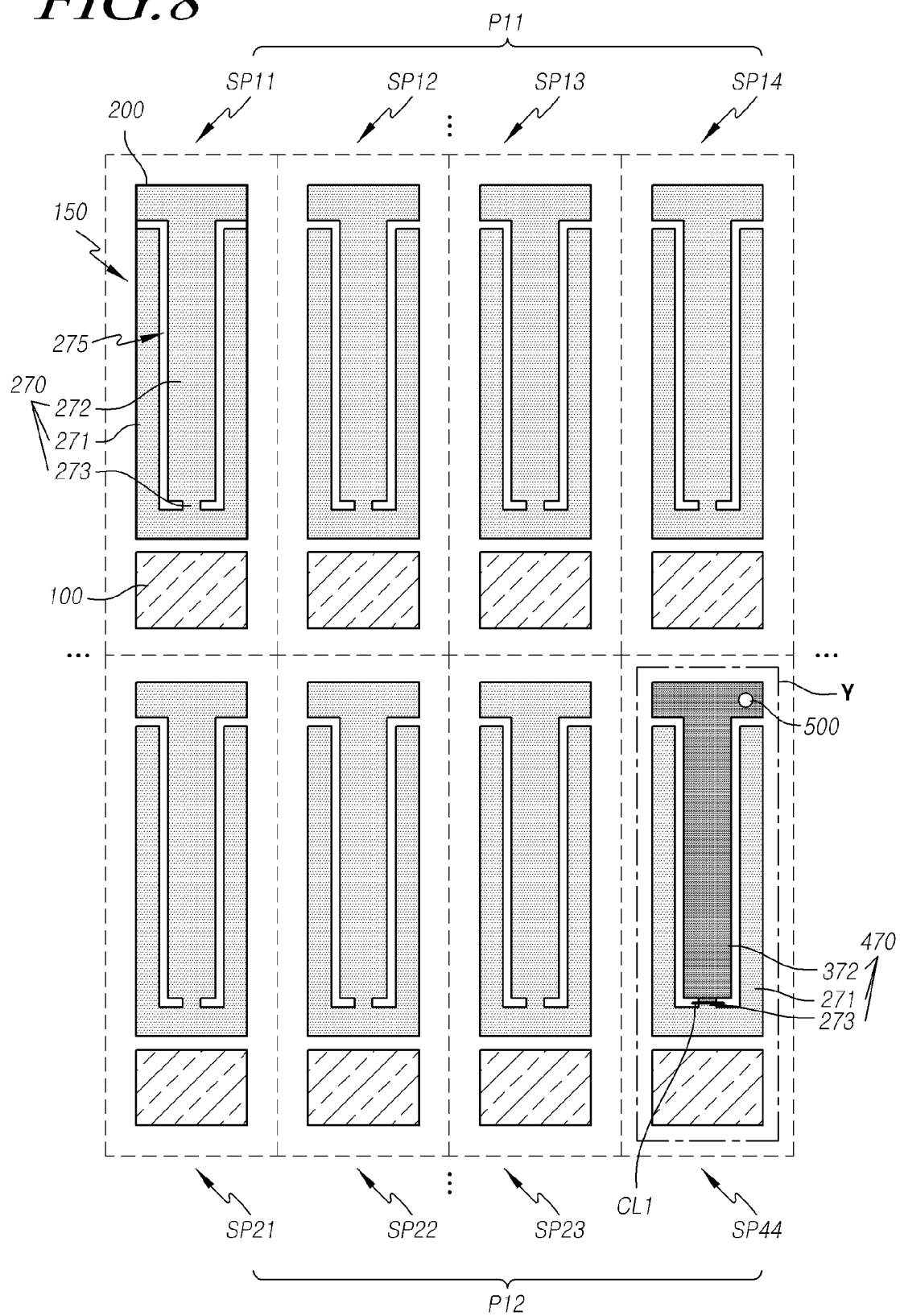
FIG. 8 is a diagram illustrating a configuration including a sub-pixel where a foreign substance is present on a second pattern of the first electrode in the organic light emitting element of the organic light emitting display device according to the first exemplary embodiment.
Figure 9:
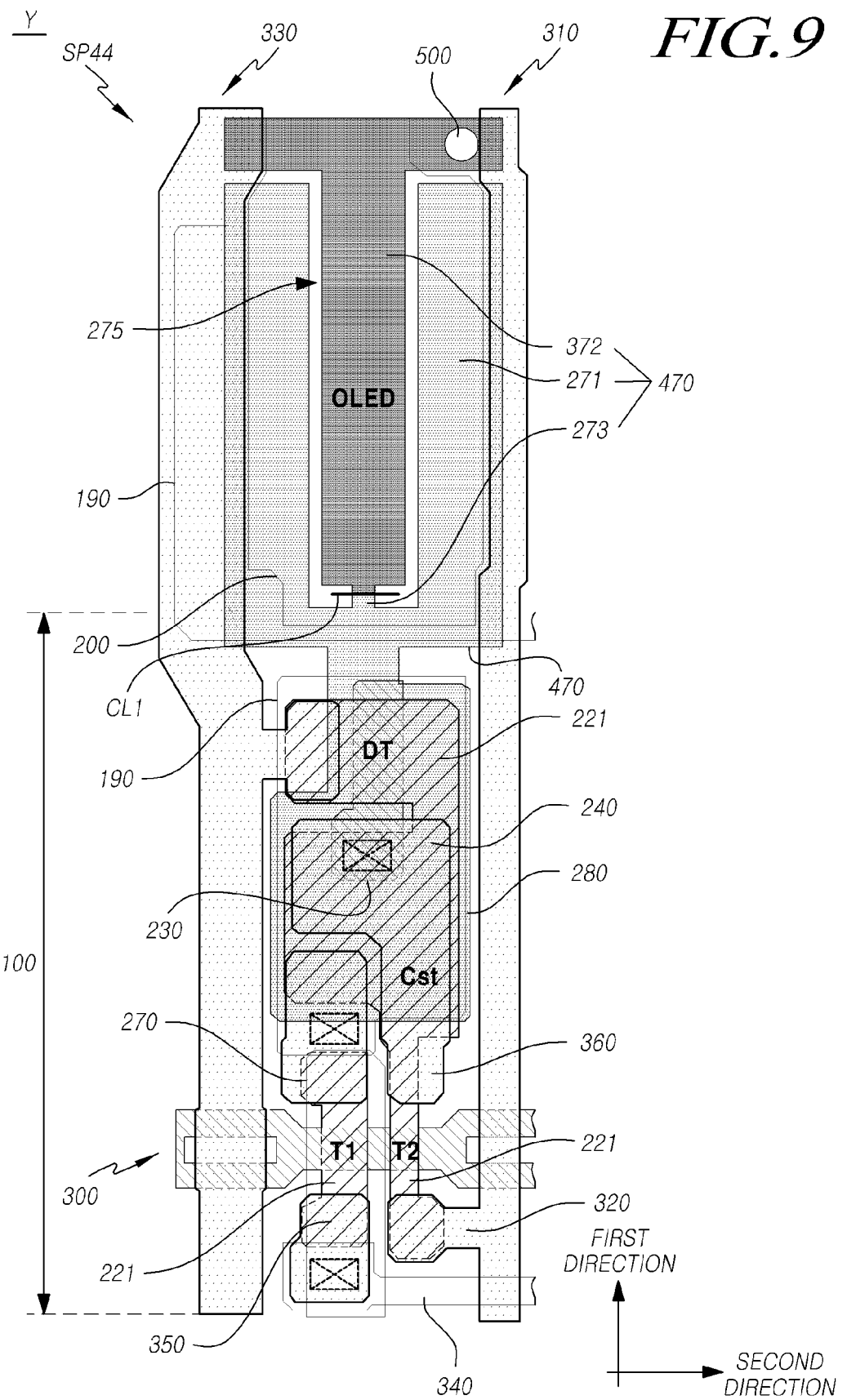
FIG. 9 is an enlarged view of region Y of FIG. 8.

Hereinafter, a driving method of an organic light emitting display device according to the first exemplary embodiment will be described in a case where a foreign substance is present on a second pattern of a first electrode. FIG. 8 is a diagram illustrating a configuration including a sub-pixel where a foreign substance is present on the second pattern of the first electrode in the organic light emitting element of the organic light emitting display device according to the first exemplary embodiment. FIG. 9 is an enlarged view of region Y of FIG. 8.

Referring to FIGS. 8 and 9, if the foreign substance 500 is present on a second pattern 372 of a first electrode 470 disposed in an eighth sub-pixel SP44 of the organic light emitting display device according to the first exemplary embodiment, the second pattern 372 of the first electrode 470 is electrically disconnected from the first and third patterns 271 and 273 by laser cutting along the cutting line CL1.

Since the second pattern 372 of the first electrode 470 where the foreign substance 500 is present is electrically disconnected, a region where the second pattern 372 is disposed does not emit a light. Meanwhile, a current may be applied from the circuit part 100 disposed in the eighth sub-pixel SP44 to the first pattern 271 and the third pattern 273 of the first electrode 470 where the foreign substance 500 is not present. As a result, an organic light emitting element of the light emitting part 150 in the eighth sub-pixel SP44 emits a light through a region where the first pattern 271 and the third pattern 273 of the first electrode 470 are disposed. Herein, since the first pattern 271 includes a first region and a second region disposed so as to be separate from each other and extended in the first direction and a third region extended in the second direction and connected to the first region and the second region, the light emitted from the regions corresponding to the first pattern 271 and the third pattern 273 can be diffused into the region where the second pattern 372 is disposed. Thus, the viewer can see the light as if it is emitted from the entire eighth sub-pixel SP44.

As such, even if the foreign substance 500 is present on the light emitting part 150, it is possible to drive a part of the light emitting part 150 without an additional repair pattern and also possible to reduce or prevent the dark spot defect through light diffusion.

Figure 10:
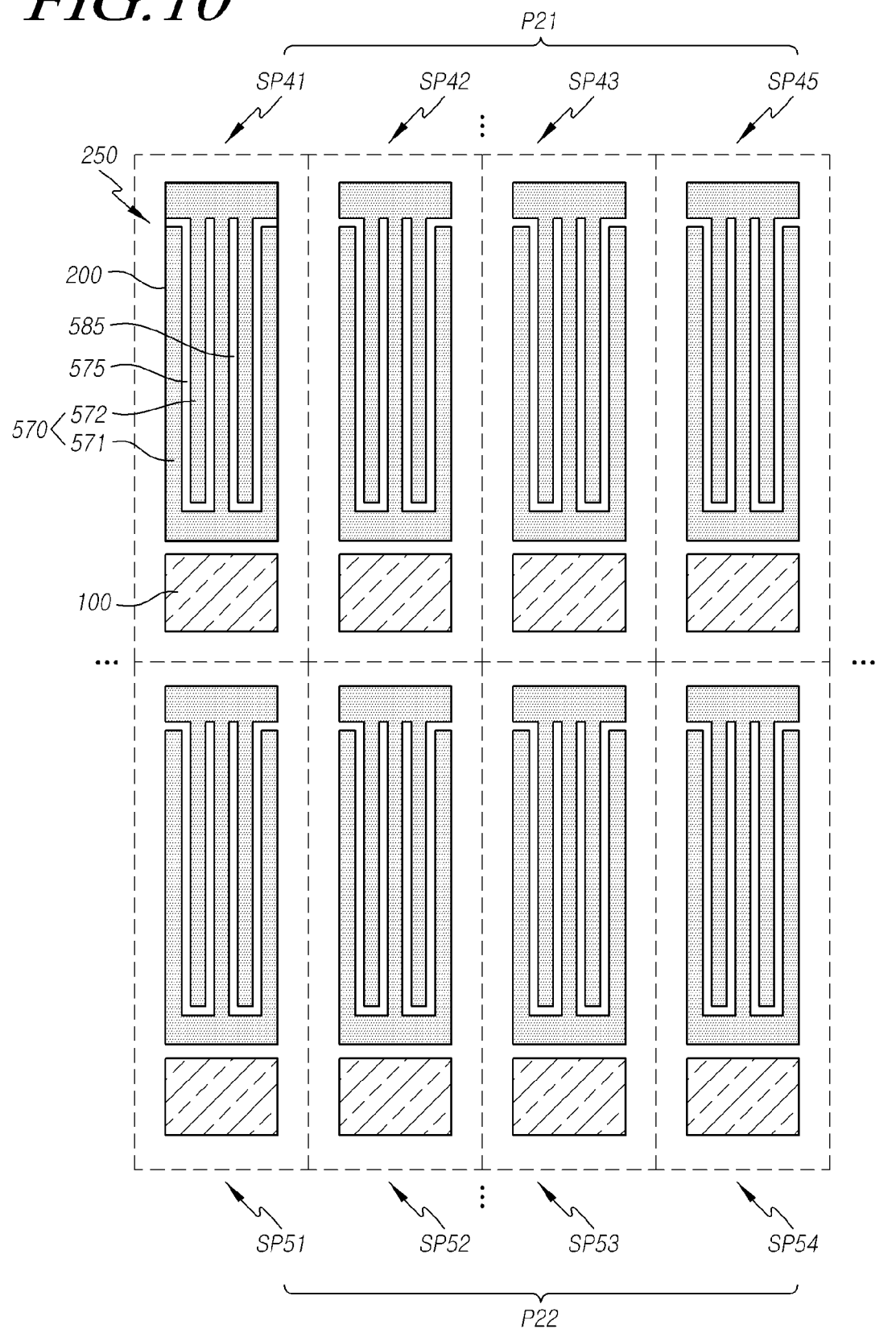
FIG. 10 is a diagram schematically illustrating a circuit part and a light emitting part in each of a plurality of sub-pixels of an organic light emitting display device according to the second exemplary embodiment.

FIG. 10 is a diagram schematically illustrating a circuit part and a light emitting part in each of a plurality of sub-pixels of an organic light emitting display device according to the second exemplary embodiment. The organic light emitting display device according to the second exemplary embodiment may include the same components as those of the above-described exemplary embodiment. Thus, any redundant description thereof may be omitted, and like components are assigned to like reference numerals.

Referring to FIG. 10, the organic light emitting display device according to the second exemplary embodiment includes a plurality of pixels P21, P22, . . . . Each of the pixels P21, P22, . . . includes a plurality of sub-pixels SP41, SP42, SP43, SP45, SP51, SP52, SP53, SP54, . . . . Each of the sub-pixels SP41, SP42, SP43, SP45, SP51, SP52, SP53, SP54, . . . includes the circuit part 100 and a light emitting part 250. The circuit part 100 may include at least one transistor. Further, the light emitting part 250 is a region opened by a bank pattern 200. A first electrode 570, an organic light emitting layer, and a second electrode of an organic light emitting element may be disposed therein. Herein, the first electrode 570 may include a first pattern 571 and a second pattern 572.

Figure 11:
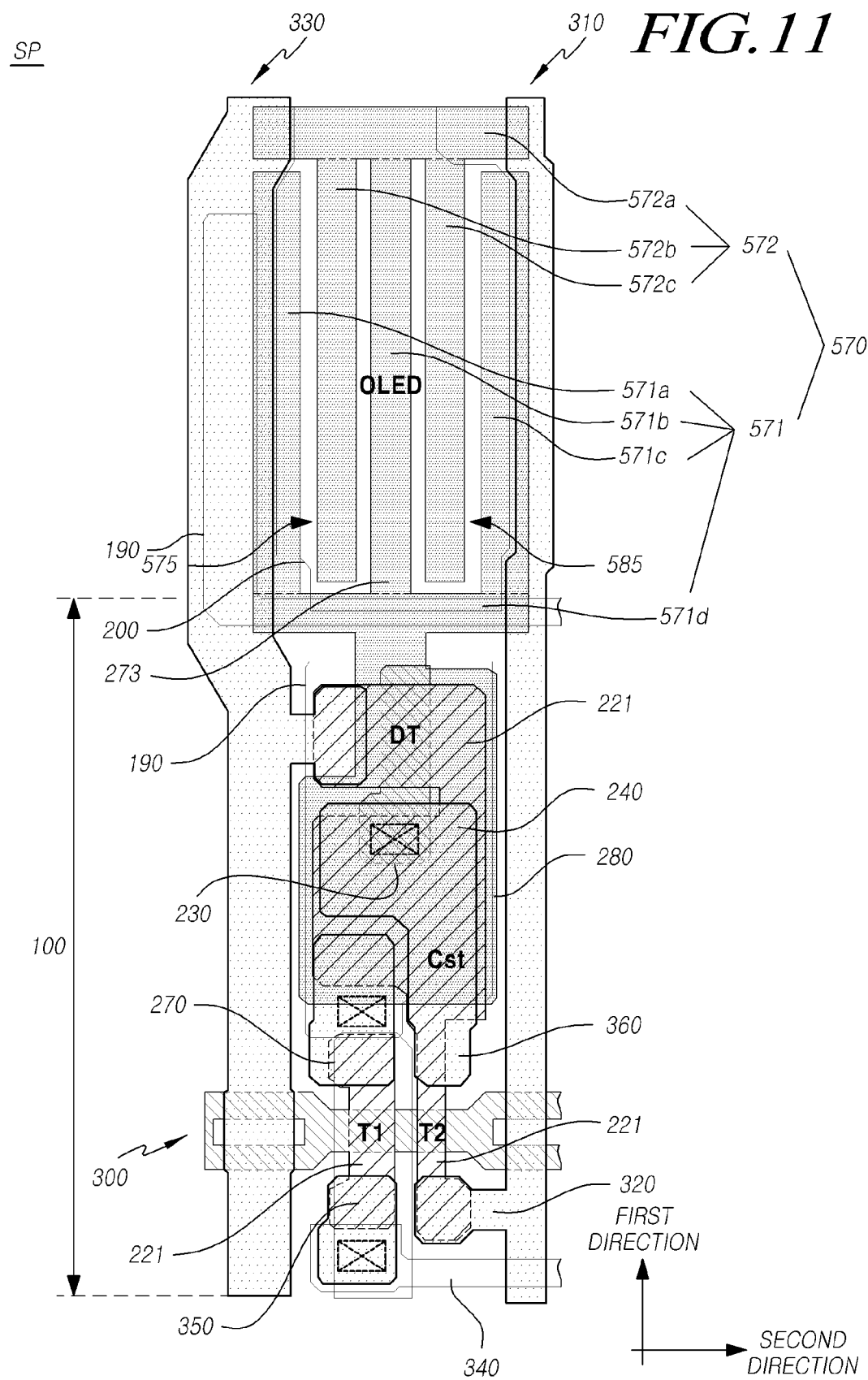
FIG. 11 is a plane view illustrating a sub-pixel of an organic light emitting display device to which the second exemplary embodiment is applied.

A configuration of a sub-pixel in a display panel to which the above-described second exemplary embodiment is applied will now be described in detail. FIG. 11 is a plane view illustrating a sub-pixel of an organic light emitting display device to which the second exemplary embodiment is applied.

Referring to FIG. 11, the first electrode 570 of the organic light emitting element OLED according to the second exemplary embodiment may include the first pattern 571 including at least two predetermined spaces 575 and 585 and the second pattern 572 coupled to the predetermined spaces 575 and 585 of the first pattern 571. Herein, the first pattern 571 may have a W-shape and the second pattern 572 may have a 1T-shape.

To be specific, the first pattern 571 of the first pattern 570 includes a first region 571a, a second region 571b, and a third region 571c extended in the first direction and disposed to be separate from each other, and the first to third regions 571a, 571b, and 571c may be connected to each other through a fourth region 571d extended in the second direction intersecting with the first direction. As the first to third regions 571a, 571b, and 571c are disposed to be separate from each other, the first pattern 571 may include the first predetermined space 575 and the second predetermined space 585 between the first region 571a and the second region 571b and between the second region 571b and the third region 571c, respectively.

Further, the second pattern 572 of the first electrode 570 includes a fifth region 572a extended in the second direction and a sixth region 572b and a seventh region 572c branched from the fifth region 572a in the second direction and separate from each other. Herein, the sixth region 572b and the seventh region 572c may be connected to each other through the fifth region 527a.

Meanwhile, the sixth region 572b of the second pattern 572 may be coupled to the first predetermined space 575, and the seventh region 572c may be coupled to the second predetermined space 585. Herein, the second region 571b of the first pattern 571 may be connected to the fifth region 572a of the second pattern 572. Accordingly, a current can be smoothly transferred to the first pattern 571 and the second pattern 572 of the first electrode 570 from the circuit part 100.

To be specific, the current transferred from the circuit part 100 is transferred to the first pattern 571 of the first electrode 570. Then, the current is transferred to the second pattern 572 of the first electrode 570 through the second region 571b of the first pattern 571. Thus, the current can be transferred to the whole first electrode 570. Accordingly, the light emitting part 250 as the region opened by the bank pattern 200 may emit a light having a specific wavelength.

Figure 12:
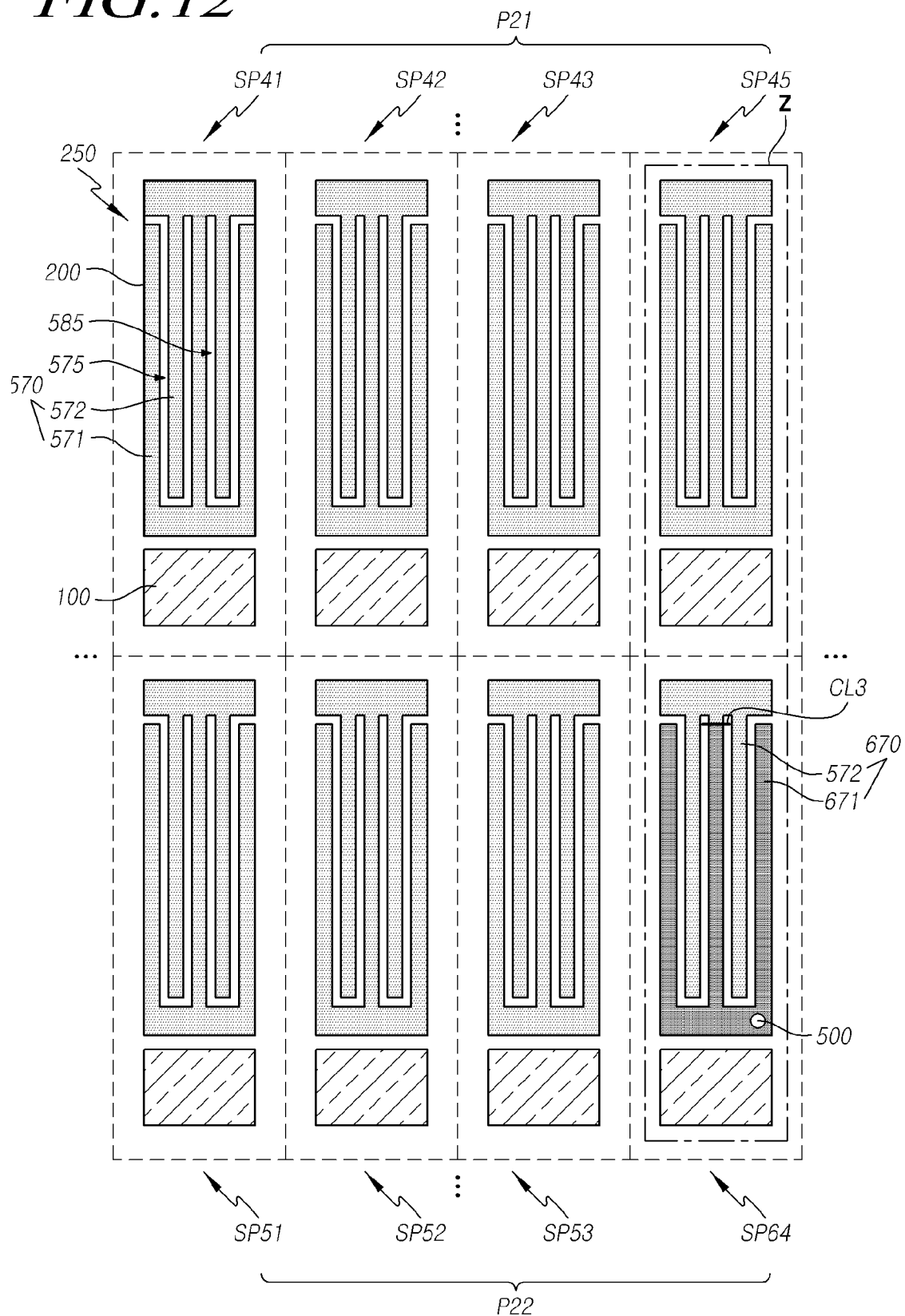
FIG. 12 is a diagram illustrating a configuration including a sub-pixel where a foreign substance is present on a first pattern of a first electrode in the organic light emitting element of the organic light emitting display device according to the second exemplary embodiment.

FIG. 12 is a diagram illustrating a configuration including a sub-pixel where a foreign substance is present on a first pattern of a first electrode in the organic light emitting element of the organic light emitting display device according to the second exemplary embodiment.

Referring to FIG. 12, the foreign substance 500 may be present on at least one of the plurality of sub-pixels of the organic light emitting display device according to the second exemplary embodiment. In FIG. 12, the sub-pixel where the foreign substance 500 is present will be described as an eighth sub-pixel SP64 by way of example.

If the foreign substance 500 is present on the light emitting part 250, a pattern of a first electrode 670 positioned at the region where the foreign substance 500 is present may be electrically disconnected from the circuit part 100. For example, as illustrated in FIG. 12, if the foreign substance 500 is present on a first pattern 671 of the first electrode 670, a part of the first pattern 671 of the first electrode 670 may be laser-cut along a cutting line CL3 to electrically disconnect the first pattern 671 of the first electrode 670 from the second pattern 572.

Further, the first pattern 671 of the first electrode 670 is electrically disconnected from the circuit part 100. Then, the second pattern 572 of the first electrode 670 where the foreign substance 500 is not present is connected to the circuit part 100 of another sub-pixel adjacent thereto. This configuration will be described in detail with reference to FIG. 13.

Figure 13:
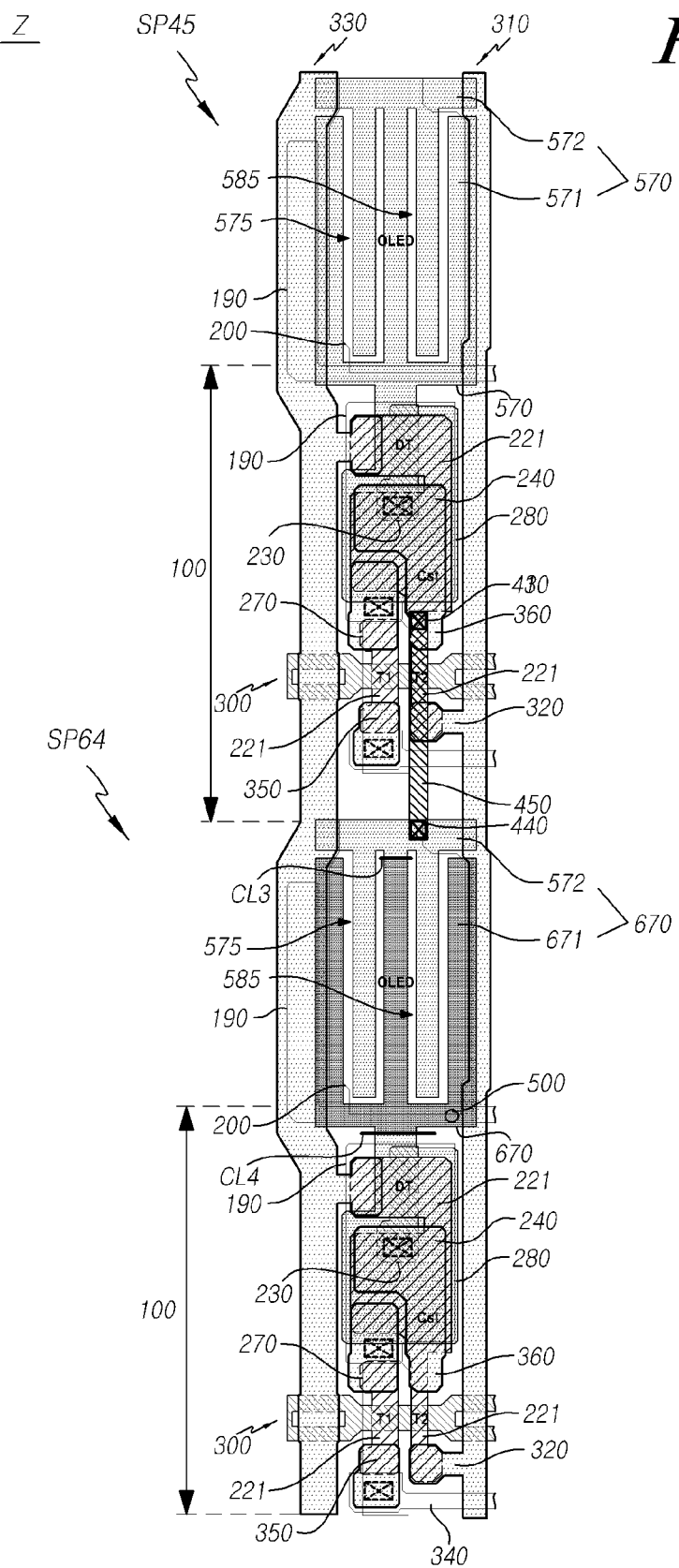
FIG. 13 is an enlarged view of region Z of FIG. 12.

FIG. 13 is an enlarged view of a region Z of FIG. 12. Referring to FIG. 13, the foreign substance 500 may be present on the first pattern 671 of the first electrode 670 in the eighth sub-pixel SP64 of the organic light emitting display device according to the second exemplary embodiment. Herein, in a region corresponding to the first pattern 671, a dark spot defect may occur due to the foreign substance 500. In order to address this problem, the second pattern 572 and the first pattern 671 of the first electrode 670 are disconnected by irradiating a laser along the first cutting line CL3. To be specific, a part of the second region in the first pattern 671 may be laser-cut to disconnect the second pattern 572 of the first electrode 670 from the first pattern 671.

As a result, a current generated from the circuit part 100 of the eighth sub-pixel SP64 is not transferred to the second pattern 572 of the first electrode 670. Further, if the foreign substance 500 is present on the first pattern 671 of the first electrode 670, the first pattern 671 may be disconnected from the circuit part 100 along a second cutting line CL4. Accordingly, it is possible to electrically disconnect the first pattern 671 that may cause a dark spot.

Meanwhile, the second pattern 572 of the first electrode 670 disposed in the eighth sub-pixel SP64 may emit a light as being electrically connected to the circuit part 100 in the sub-pixel SP45 adjacent to the eighth sub-pixel SP64.

To be specific, the second pattern 572 of the first electrode 670 disposed in the eighth sub-pixel SP64 may be connected to the plate 240 of the fourth sub-pixel SP45 through a first contact hole 430 by forming a repair pattern 450 through a welding process of irradiating a laser. In other words, the repair pattern 450 may be connected to the plate 240 of the fourth sub-pixel SP45 through the first contact hole 430 and may also be connected to the second pattern 572 of the first electrode 670 in the eighth sub-pixel SP64 through a second contact hole 440. As a result, the eighth sub-pixel SP64 of the organic light emitting display device according to the second exemplary embodiment may be supplied with a current from the fourth sub-pixel SP45 to emit a light. In other words, the circuit part 100 included in the fourth sub-pixel SP45 may drive the light emitting part of the fourth sub-pixel SP45 and a part of the light emitting part of the eighth sub-pixel SP64.

As described above, if the organic light emitting element OLED emits a light in the region corresponding to the second pattern 572 of the first electrode 670 in the eighth sub-pixel SP64, the organic light emitting element OLED emits a light in the region corresponding to the second pattern 572 of the first electrode 670 and the light is diffused, so that the viewer can see the light as if it is emitted from the entire light emitting part in the eighth sub-pixel SP64, which can reduce or prevent the dark spot defect that may be caused by the foreign substance 500.

Figure 14:
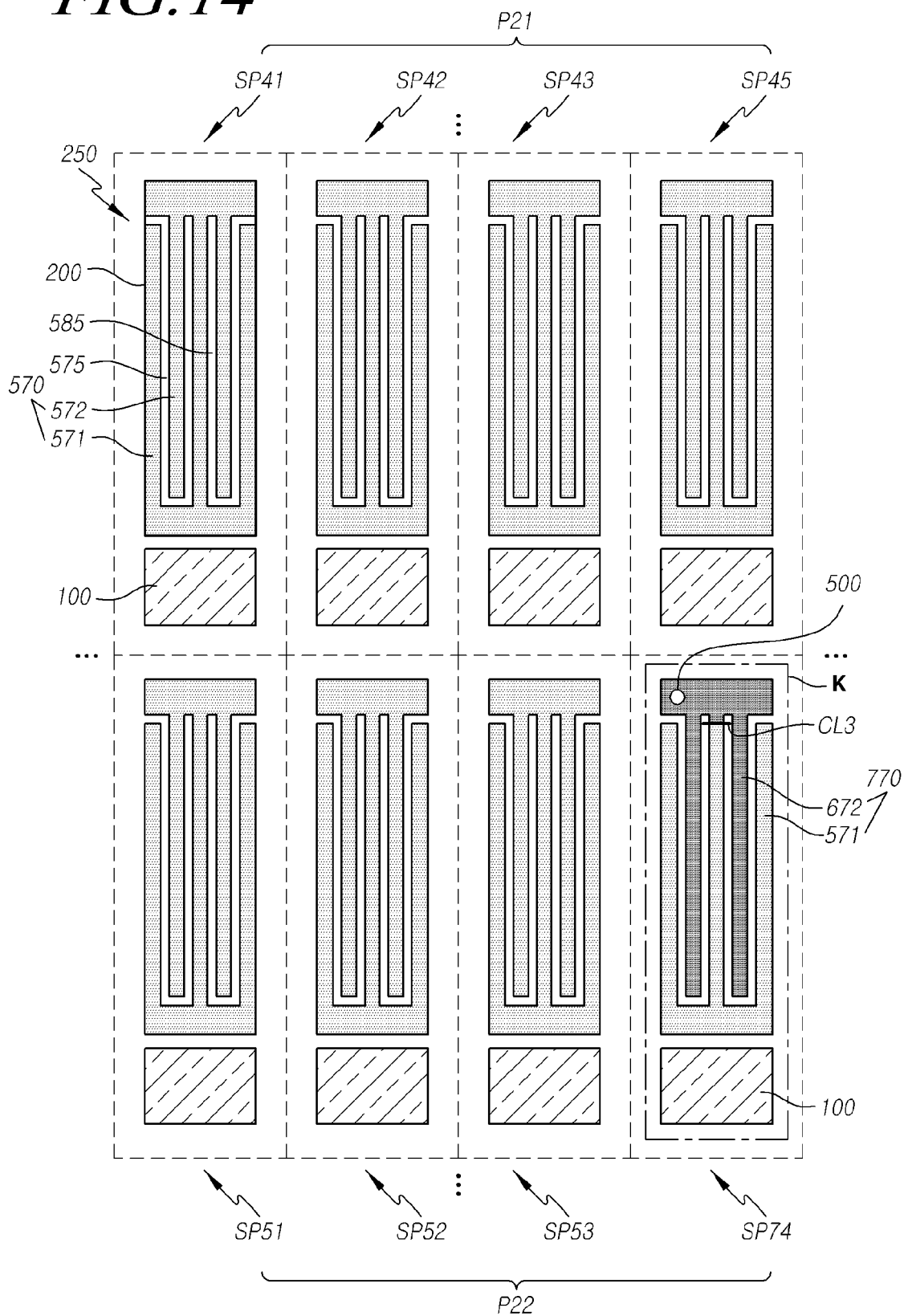
FIG. 14 is a diagram illustrating a configuration including a sub-pixel where a foreign substance is present on a second pattern of the first electrode in the organic light emitting element of the organic light emitting display device according to the second exemplary embodiment.
Figure 15:
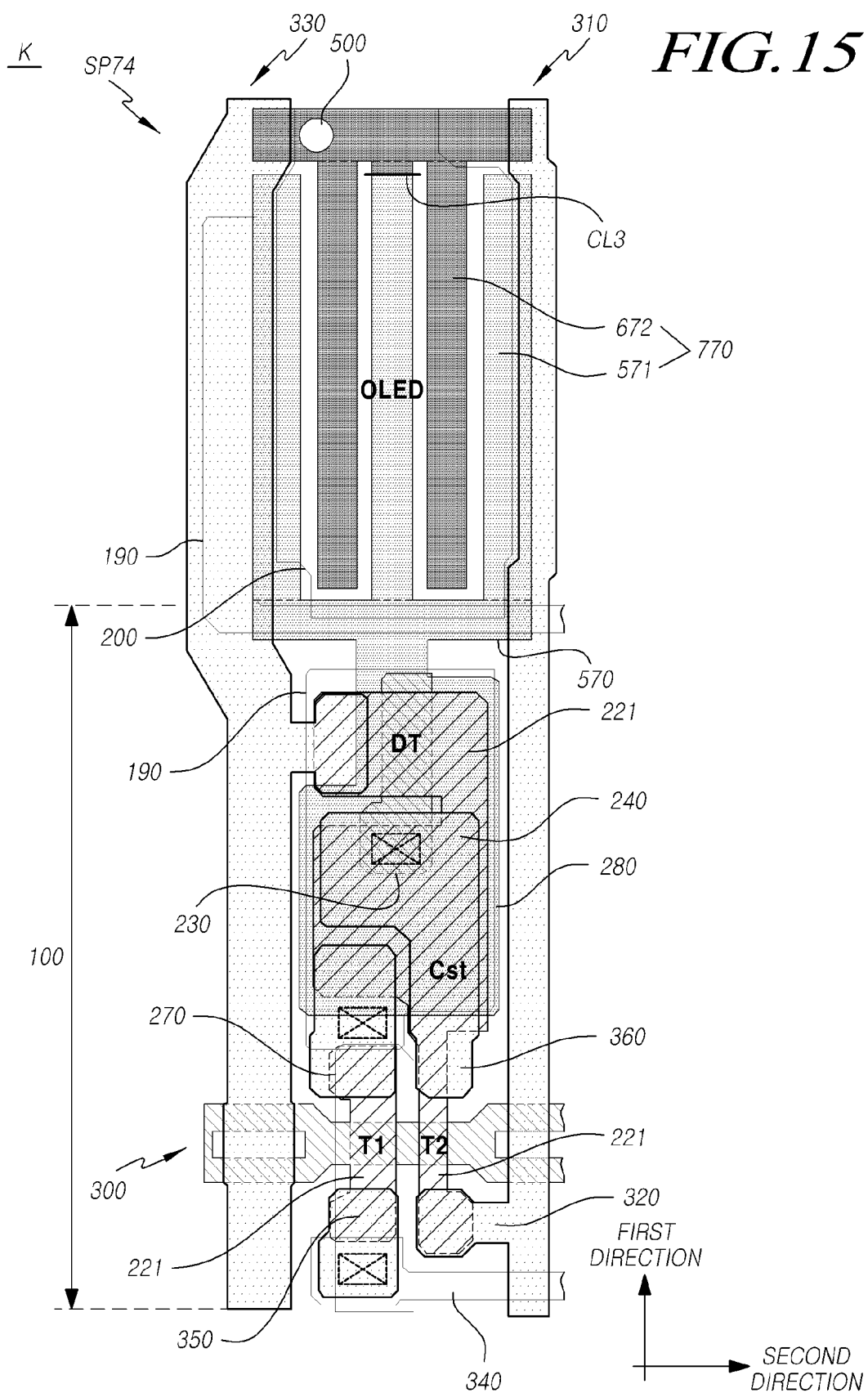
FIG. 15 is an enlarged view of region K of FIG. 14.

Hereinafter, a driving method of an organic light emitting display device according to the second exemplary embodiment will be described in a case where a foreign substance is present on a second pattern of a first electrode. FIG. 14 is a diagram illustrating a configuration including a sub-pixel where a foreign substance is present on a second pattern of the first electrode in the organic light emitting element of the organic light emitting display device according to the second exemplary embodiment. FIG. 15 is an enlarged view of region K of FIG. 14.

Referring to FIGS. 14 and 15, if the foreign substance 500 is present on a second pattern 672 of a first electrode 770 disposed in an eighth sub-pixel SP74 of the organic light emitting display device according to the second exemplary embodiment, the second pattern 672 of the first electrode 770 is electrically disconnected from the first patterns 571 by a laser cutting along the cutting line CL1.

Since the second pattern 672 of the first electrode 770 where the foreign substance 500 is present is electrically disconnected, an organic light emitting element OLED does not emit a light from a region corresponding to the second pattern 672. Further, a current may be applied from the circuit part 100 disposed in the eighth sub-pixel SP74 to the first pattern 571 of the first electrode 770 where the foreign substance 500 is not present. As a result, the organic light emitting element OLED of the light emitting part 250 in the eighth sub-pixel SP74 may emit a light from a region where the first pattern 671 in the first electrode 770 of the organic light emitting element is disposed.

As such, if the foreign substance 500 is present on the light emitting part 250, it is possible to drive a part of the light emitting part 250 without an additional repair pattern and also possible to reduce or prevent the dark spot defect through light diffusion.

Figure 16:
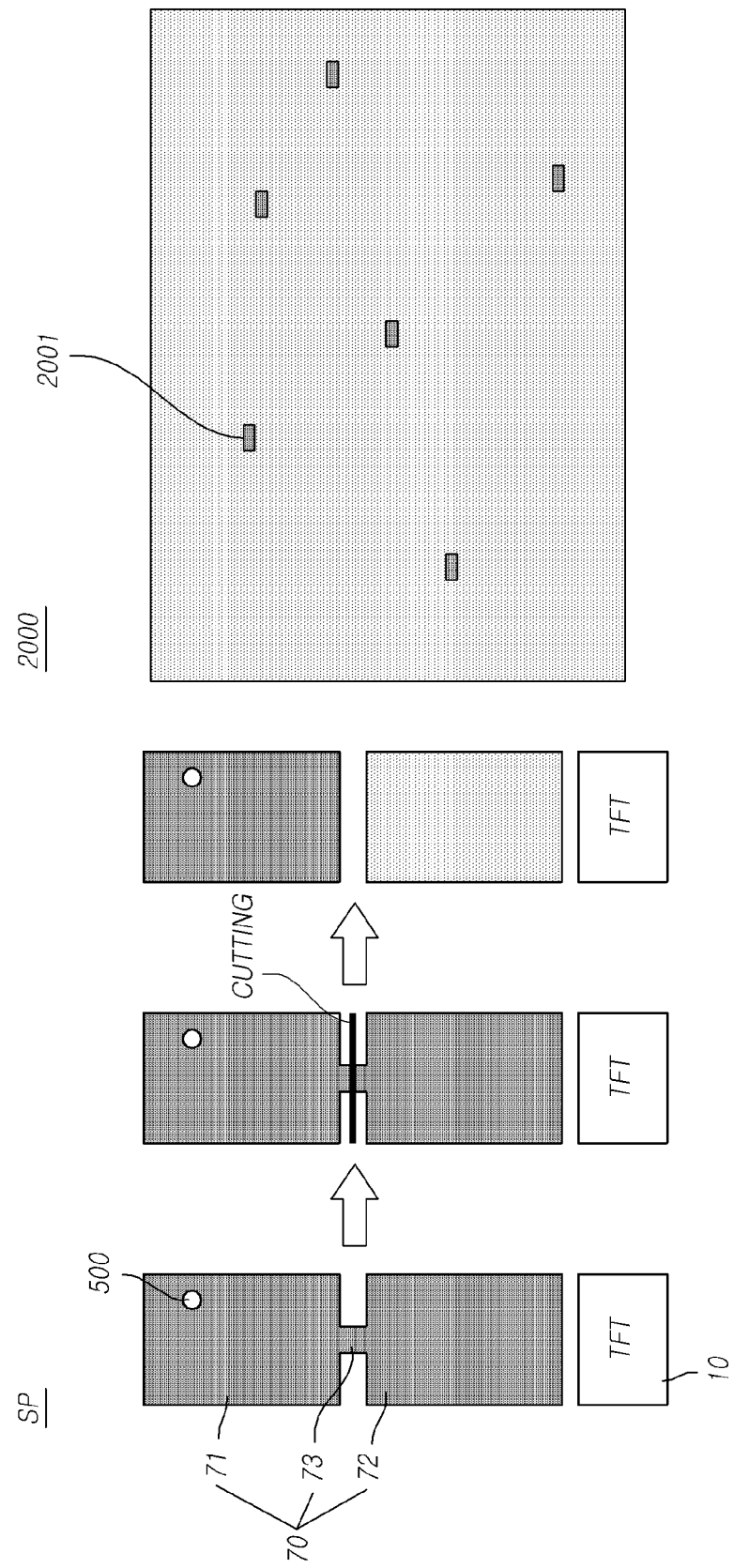
FIG. 16 is a diagram illustrating a sub-pixel and a panel of an organic light emitting display device according to a comparative example.

Hereinafter, the visibility of organic light emitting display devices according to a comparative example and an exemplary embodiment will be compared with reference to FIG. 16 and FIG. 17, respectively. FIG. 16 is a diagram illustrating a sub-pixel and a panel of an organic light emitting display device according to a comparative example. FIG. 17 is a diagram illustrating a sub-pixel and a panel of an organic light emitting display device according to the first exemplary embodiment.

Referring to FIG. 16 and FIG. 17, an organic light emitting display panel 2000 according to the comparative example has a configuration in which a foreign substance 500 is present on a top portion 71 of a first electrode 70 of an organic light emitting element disposed in a sub-pixel SP. Herein, the first electrode 70 according to the comparative example may include the top portion 71, a bottom portion 72, and a central portion 73 between the top portion 71 and the bottom portion 72.

Meanwhile, if the foreign substance 500 is present on the top portion 71 of the first electrode 70 according to the comparative example, the top portion 71 and the central portion 73 of the first electrode 70 may be electrically disconnected from each other by cutting the central portion 73, and after a repairing process, only the bottom portion 72 of the first electrode 70 where the foreign substance 500 is not present can be driven. That is, since the top portion 71 and the central portion 73 of the first electrode 70 are electrically disconnected from each other, organic light emitting elements disposed corresponding to the top portion 71 and the central portion 73 of the first electrode 70 do not emit a light. Herein, the region corresponding to the top portion 71 and the central portion 73 of the first electrode 70 becomes a semi-dark spot 2001 when the organic light emitting display panel 1000 is driven, which reduces the visibility and the yield of the organic light emitting display panel 2000.

On the other hand, as illustrated in FIG. 17, the organic light emitting display panel 1000 according to the first exemplary embodiment includes the first electrode 370 of the organic light emitting element disposed in the sub-pixel SP including the first pattern 371, the second pattern 272, and the third pattern 273 electrically connecting the first pattern 371 and the second pattern 272, and has a configuration in which the foreign substance 500 is present on a region corresponding to the first pattern 371.

If the foreign substance 500 is present on the first pattern 371 of the first electrode 370 according to the first exemplary embodiment, the first pattern 371 is electrically disconnected from the third pattern 273 by cutting the third pattern 273, and after a repairing process, the second pattern 272 is driven but not the first pattern 371. That is, since the first pattern 371 and the third pattern 273 of the first electrode 370 are electrically disconnected from each other, organic light emitting elements disposed in a region corresponding to the first pattern 371 and the third pattern 273 of the first electrode 370 may not emit a light.

However, since the first electrode 370 of the organic light emitting element according to the first exemplary embodiment includes the first pattern 371 including a plurality of regions and the second pattern 272 including a plurality of regions and some of the plurality of regions in the first pattern 371 and some of the plurality of regions in the second pattern 272 are disposed alternately, even if the organic light emitting element emits a light from the region corresponding to the second pattern 272, the viewer can the light as if it is emitted from the entire light emitting part due to light diffusion. Accordingly, the visibility and the yield of the organic light emitting display panel 1000 can be improved.

The features, structures, effects, etc. described in the above exemplary embodiments are included in at least one exemplary embodiment and but are not limited to one exemplary embodiment. In addition, the features, structures, effects, etc. described in the respective exemplary embodiments may be executed by those skilled in the art while being combined or modified with respect to other embodiments. Accordingly, it will be understood that contents related the combination and modification will be included in the scope of the present disclosure.

Further, it should be understood that the exemplary embodiments described above should be considered in a descriptive sense only and not for purposes of limitation. It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An organic light emitting display (OLED) device including a plurality of subpixels on an array substrate, each sub-pixel comprising:
   a circuit part including a switching transistor, a driving transistor and a capacitor; and
   a light emitting part having a shape defined with a width and a length and including a first electrode electrically connected to the driving transistor, an organic light emitting layer and a second electrode, the first electrode including a first pattern having a recess, a second pattern having a protrusion received in the recess, and a third pattern directly contacting the first and second patterns,
   wherein a depth of the recess is greater than a half of a longer of the width and the length of the light emitting part,
   wherein the first pattern, which is a connected unitary structure, includes a first region and a second region extended in a first direction disposed so as to be separate from each other and a third region extended in a second direction intersecting with the first direction,
   wherein the second pattern, which is a connected unitary structure, includes a fourth region extended in the second direction and a fifth region extended in the first direction and connected to a part of the fourth region,
   wherein a current from the circuit part is transferred to the first pattern, the current transferred to the first pattern is transferred to the second pattern through the third pattern and the light emitting part emit a light a specific wavelength,
   wherein each of regions corresponding to the first, second, and third patterns in one light emitting part emits a light of the same color.

2. The OLED device according to claim 1, wherein the first pattern and the second pattern are spaced apart from each other with a gap, except an area where the third pattern is disposed.

3. The OLED device according to claim 1, wherein each of the first pattern and second pattern has a plurality of protrusions that are alternately arranged in the light emitting part.

4. The OLED device according to claim 2, wherein the gap is an area that does not emit a light in the light emitting part.

5. The OLED device according to claim 1, wherein the circuit part further includes a compensation circuit configured to compensate a threshold voltage of the driving transistor.

6. The OLED device according to claim 1, wherein the first pattern has a shape of 'U' or 'W'.

7. The OLED device according to claim 1, wherein the second pattern has a shape of 'T' or 'π'.

8. The OLED device according to claim 1, wherein an electrode of the driving transistor is connected to the first pattern of the first electrode.

9. The OLED device according to claim 1, wherein the first pattern has a plurality of recesses and the second pattern has a plurality of protrusions.

10. The OLED device according to claim 9, wherein a number of each of the protrusions and the recesses are two.

11. The OLED device according to claim 10, wherein the third pattern connects a region of the first pattern located between the two recesses to the second pattern.

12. The OLED device according to claim 9, wherein the recesses of the first pattern and the protrusions of the second pattern are alternating.

* * * * *